United States Patent
Lee

(10) Patent No.: US 8,278,639 B2
(45) Date of Patent: Oct. 2, 2012

(54) HIGH INTEGRATION PHASE CHANGE MEMORY DEVICE HAVING REDUCED THICKNESS PHASE CHANGE LAYER AND FABRICATION METHOD THEREOF

(75) Inventor: Se Ho Lee, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 124 days.

(21) Appl. No.: 12/647,177

(22) Filed: Dec. 24, 2009

(65) Prior Publication Data

US 2011/0121250 A1    May 26, 2011

(30) Foreign Application Priority Data

Nov. 26, 2009 (KR) .................. 10-2009-0115153

(51) Int. Cl.
*H01L 47/00* (2006.01)
(52) U.S. Cl. .................. 257/2; 257/4; 257/5; 257/506; 257/544; 257/E31.029

(58) Field of Classification Search ............ 438/99–104; 257/110, 279, 458, 461–464, 470, 490, 494–495, 257/509, 525, 544–550, 656, 927, 929
See application file for complete search history.

(56) References Cited

U.S. PATENT DOCUMENTS

2010/0054029 A1* 3/2010 Happ et al. .................. 365/163
2010/0301304 A1* 12/2010 Chen et al. ........................ 257/5

FOREIGN PATENT DOCUMENTS

| KR | 1020070102295 A | 10/2007 |
| KR | 1020080039701 A | 5/2008 |
| KR | 1020090079726 A | 7/2009 |

* cited by examiner

*Primary Examiner* — Mamadou Diallo
(74) *Attorney, Agent, or Firm* — Ladas & Parry LLP

(57) ABSTRACT

A high integration phase change memory device includes a semiconductor substrate including an access device, a heating electrode formed on the access device, a phase change nano band formed on the heating electrode, and an interlayer insulating layer for supporting the phase change nano band formed in both sides of the phase change nano band.

23 Claims, 5 Drawing Sheets

HIGH INTEGRATION PHASE CHANGE MEMORY DEVICE HAVING REDUCED THICKNESS PHASE CHANGE LAYER AND FABRICATION METHOD THEREOF

CROSS-REFERENCES TO RELATED APPLICATION

The present application claims priority under 35 U.S.C. 119(a) to Korean application number 10-2009-0115153, filed on Nov. 26, 2009, in the Korean Patent Office, which is incorporated by reference in its entirety as if set forth in full.

BACKGROUND OF THE INVENTION

1. Technical Field

The present invention relates generally to a non-volatile semiconductor memory device and, more particularly, to a high integration phase change memory device and a method of manufacturing the same.

2. Related Art

A phase change memory device is a type of non-volatile memory device that includes a phase change material, and a resistance of the phase change material is varied depending on a temperature. For example, the phase change material may be a chalcogenide (GST)-based material comprised of germanium (Ge), antimony (Sb) and tellurium (Te). The phase change material is "phase-changed" between an amorphous state and a crystalline state depending on the temperature, thereby defining a RESET state of logic level "1" and a SET state of logic level "0".

Each of the memory cells in a phase change memory device may be comprised of a variable resistor formed of the phase change material and a switching device, for selectively driving the variable resistor, and the phase change material and the switching device are connected between a word line and a bit line. In such a phase change memory device, the word line may be formed of a junction region in a semiconductor substrate, the bit line may be formed of a wire pattern, and a diode or a MOS transistor may be used as the switching device.

Recently, areas of focus in the phase change memory include ensuring a lower reset current in the phase change memory device and embodying the phase change memory in a multi-level, for example where one cell can store plural bits. In attempts to ensure a lower reset current, reduction of a contact area between the phase change material layer and a heating electrode has been considered, for example forming the heating electrode to have as small a line width as possible. However, further reduction of the line width of the heating electrode is considered difficult, as limitations of an exposure apparatus make it difficult to reduce the line width below a resolution of a light source.

The multi-level phase change memory device is embodied by applying various write voltages. However, a resistance distribution to each of voltage bandwidths is not distinct, as such reproducibility is not good.

SUMMARY

Embodiments of the present invention include a high integration phase change memory device having a reduced a reset current and a multi level phase change memory device without restriction of an exposure limit and a method of manufacturing the same.

According to one aspect of an exemplary embodiment, a high integration phase change memory device includes a semiconductor substrate including an access device, a heating electrode formed on the access device, a phase change nano band formed on the heating electrode, and an interlayer insulating layer for supporting the phase change nano band formed in both sides of the phase change nano band.

According to another aspect of another exemplary embodiment, a high integration phase change memory device includes a vertical diode, a heating electrode formed on the vertical diode, a plurality of phase change nano bands formed on the heating electrode, and an interlayer insulating layer for supporting both sides of the plurality of phase change nano bands formed in the both sides of the plurality of phase change nano bands. A total line width of the plurality of phase change nano bands is smaller than a line width of the heating electrode and the plurality of phase change nano bands have different phase change properties each other.

According to still another aspect of another exemplary embodiment, there is provided a method of manufacturing a high integration phase change memory device. First, a plurality of access devices is formed on a semiconductor device. A plurality of heating electrodes is formed on the plurality of access devices, respectively. Next, a first interlayer insulating layer having a trench exposing a pair of heating electrodes is formed on the plurality of heating electrodes. Subsequently, phase change nano bands are formed in both side walls of the trench and a second interlayer insulating layer is filled between the phase change nano bands.

According to still another aspect of an exemplary embodiment, there is provided a method of manufacturing a high integration phase change memory device. First, an insulating layer which a plurality of access devices on a semiconductor substrate and a plurality of heating electrodes on the plurality of access devices are arranged in is provided. A first interlayer insulating layer having a trench exposing a pair of heating electrodes is formed on the insulating layer. A plurality of phase change nano bands contacted with each of the plurality of heating electrodes on both side walls of the trench in the first interlayer insulating layer. A second interlayer insulating layer is filled between the plurality of phase change nano bands within the trench. The plurality of phase change nano bands has different phase change properties each other.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
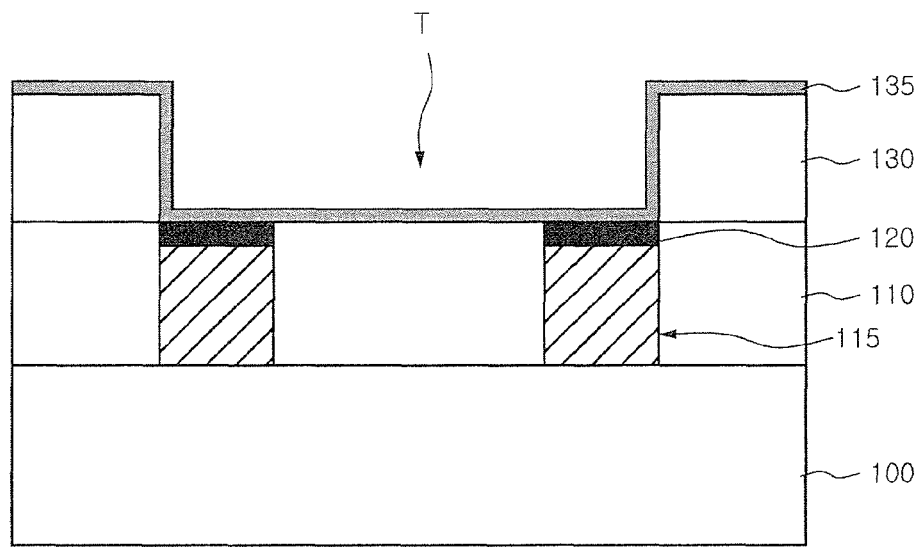
FIGS. 1 through 4 are cross-sectional views shown for illustrating a method of manufacturing a high integration phase change memory device according to an exemplary embodiment.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 3:
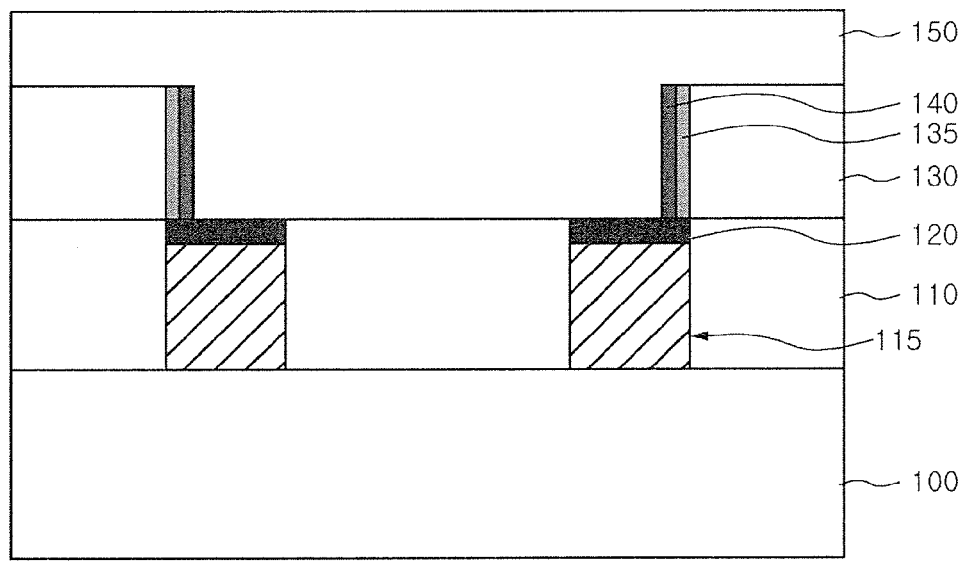
Figure 4:
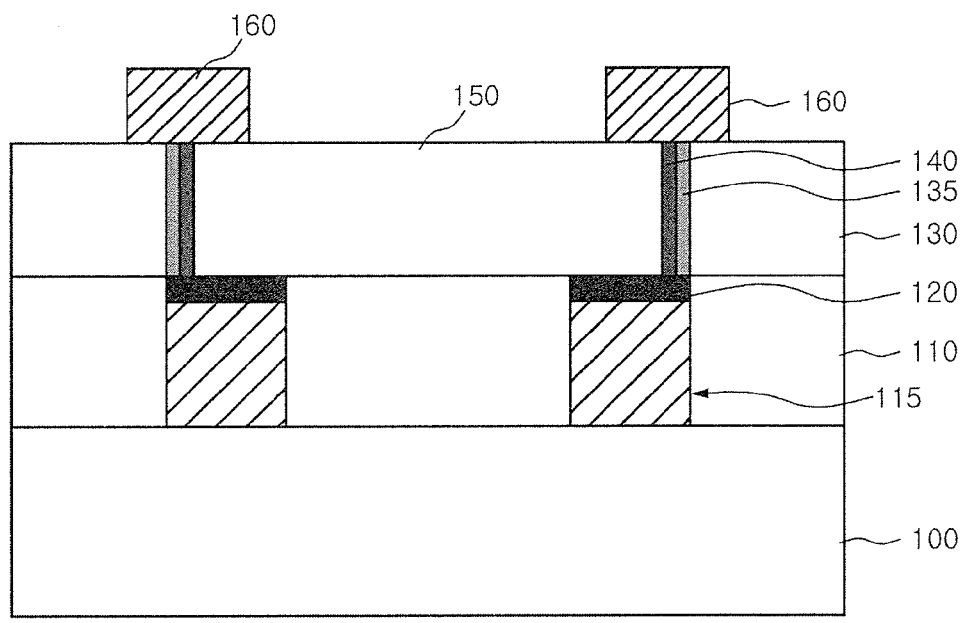
Figure 5:
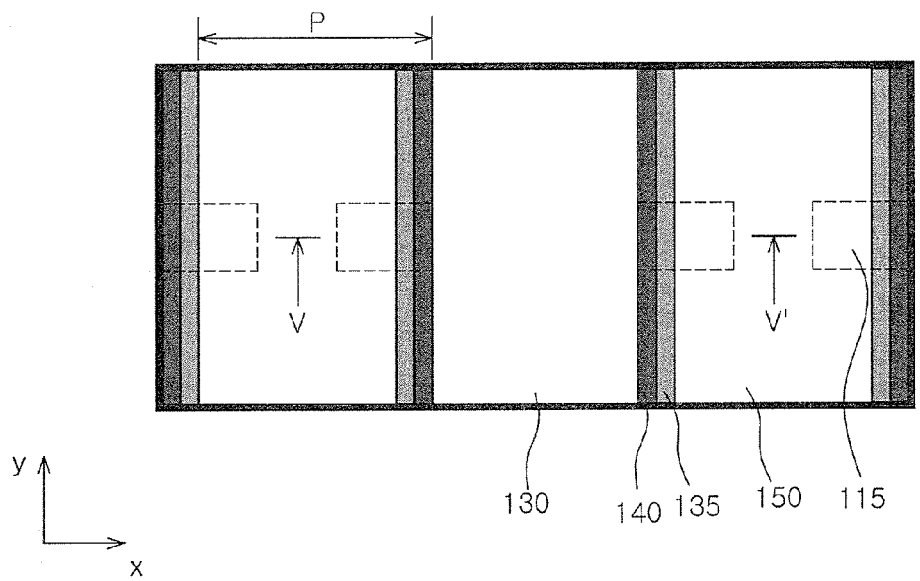
FIG. 5 is a plan view of the high integration phase change memory device according to an exemplary embodiment.

FIGS. 1 to 4 are cross-sectional views shown for illustrating a method of manufacturing a high integration phase change memory device according to an exemplary embodiment, and FIG. 5 is a plan view of the high integration phase change memory device according to an exemplary embodiment. FIGS. 1 to 4 show cross-sectional views taken along the line V-V' of FIG. 5 in sequence.

Referring to FIGS. 1 and 5, an insulating layer 110 is formed on a semiconductor substrate 100. For example, the semiconductor substrate 100 may comprise a silicon substrate and an impurity region (not shown) serving as a word line may be formed in the semiconductor substrate 100. An access device is formed in the insulating layer 110 to be connected to the impurity region. In the exemplary embodiment, a vertical diode 115 occupying a relatively narrow space to a MOS transistor, is used as an access device, but the present invention is not limit thereto. According to an embodiment of the present invention, a plurality of vertical diodes 115 configured as an access device may be arranged on the semiconductor substrate 100 equally spaced from each other.

Each of the vertical diode 115 may be comprised of a PN diode. A PN diode can be formed by etching a portion of the insulating layer 110 to form a contact hole (not shown) exposing the impurity region and by growing a selective epitaxial growth (SEG) layer within the contact hole. If a metal word line (not shown) is interposed between the junction region and the insulating layer to improve the word line resistance, each of the vertical diodes 115 may be comprised of a schottky diode. A schottky diode can be formed by depositing a polysilicon layer within the contact hole. The vertical diode 115 is formed to have a height less than a depth of the contact hole such that a space is provided at an upper portion of the contact hole above the vertical diode 115 disposed therein.

Next, a conductive layer is disposed so as to fill in the upper portion of the contact hole and then planarized to form each of a plurality of heating electrodes 120 as shown in FIG. 1. Each of the plurality of heating electrodes have a line width substantially equal to the width of the vertical diode 115 at the upper portion of the contact hole. Accordingly, it is not necessary to carry out a separate lithography process for forming the heating electrodes 120.

A first interlayer insulating layer 130 is formed on the resultant semiconductor substrate 100 including the plurality of vertical diodes 115. A portion of the first interlayer insulating layer 130 is etched to form a trench T. As shown in FIG. 1, the trench T exposes the plurality of heating electrode 120. As shown in FIGS. 1 and 5, the trench T may expose a pair of heating electrode 120 in an X direction and expose the plurality of heating electrodes 120 in a Y direction. As shown in FIG. 5, the X direction is an elongated direction of the word line and the Y direction is an elongated direction of the bit line. A capping material layer 135 is formed on an upper surface of the first interlayer insulating layer 130 and on the surfaces which define the trench T.

Figure 2:
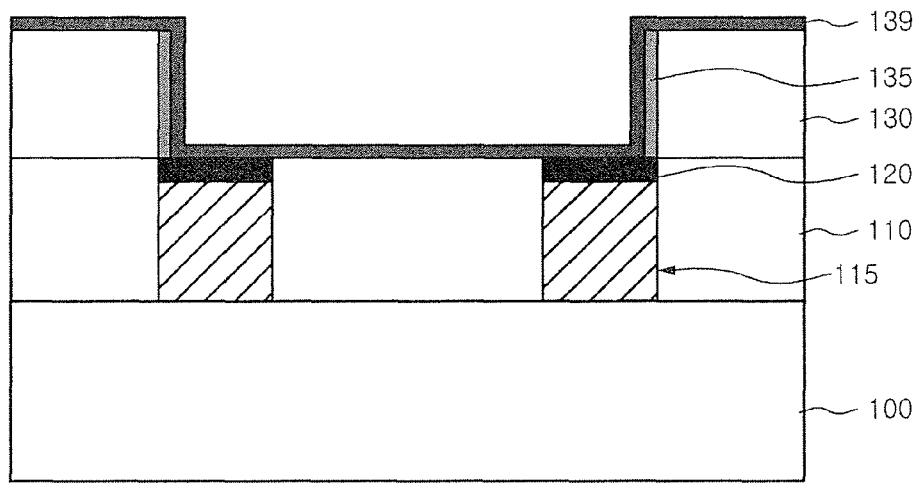

Referring to FIGS. 2 and 5, the capping material layer 135 is anisotropically etched to expose the upper surfaces of the first interlayer insulating layer 130, the insulating layer 110, and the heating electrodes 120, such that the capping material layer 135 remains at both side walls of the trench T. The remaining capping material layer 135 serves as capping layers. A phase change material layer 139 is deposited on the upper surface of the first interlayer insulating layer 130 and exposed surfaces of the capping layers 135, the heating electrodes 120 and the insulating layer 110. According to an embodiment of the present invention, the phase change material layer 139 may be deposited at a thickness of below a minimum line width which can be fabricated through a photolithography process. For example, the phase change material layer 139 may be deposited at a thickness in the range of several nm to several tens of nm. When the phase of the phase change material layer 139 is changed, the capping layers 135 shield phase change materials from diffusion. The Capping layer 135 may be comprised of silicon oxide or silicon nitride, but it is not limit thereto.

Referring to FIGS. 3 and 5, the phase change material layer 139 is anisotropically etched to expose the upper surface of the first interlayer insulating layer 130 and upper surfaces of the insulating layer 110 and the heating electrodes 120, thereby forming phase change nano bands 140 on side walls of the capping layers 135. The phase change nano bands 140 have line widths in the range of several nm to several tens of nm, and are elongated along the side walls of the trench T in the elongated direction of the bit line.

Herein, as shown in FIG. 5, each of the phase change nano bands 140 is elongated along the y direction, that is, the elongated direction of the bit line, and each of the phase change nano bands 140 is electrically connected to the plurality of heating electrodes 120 arranged along the y direction. Therefore, according to an embodiment of the present invention, a contact area between the heating electrode 120 and the phase change nano band 140 can be reduce to a desired line width without requiring a multi-patterning process for forming the heating electrode 120 and the phase change material layer 139 to have fine line widths. In particular, since the line width of the phase change nano band 140 is determined by a deposition thickness of the phase change nano band 140, that is, the phase change material layer 139, the line width of the phase change nano band 140 can be flexibly set according to embodiments of the present invention. Subsequently, a second interlayer insulating layer 150 is formed to be sufficiently buried within the trench T, for example, the second insulating interlayer 150 is formed so as to fill the trench T.

Referring to FIGS. 4 and 5, the second interlayer insulating layer 150 is planarized to have the same height as the phase change nano bands 140 and the first interlayer insulating layer 130. A chemical mechanical polishing (CMP) process may be carried out as the planarization process, although it should be understood that this is by way of example only, and the present invention is not limited hereto. As shown in FIG. 4, though omitted for clarity in FIG. 5, upper electrodes 160 are formed on the phase change nano bands 140. Herein, in FIG. 5, "P" designates a pitch of the phase change memory cell. If the phase change nano band 140 is embodied according to the above exemplary embodiment, the phase change memory cell having a pitch of below 20 nm can be manufactured.

According to exemplary embodiments, the heating electrode 120 is formed within the upper portion of the contact hole having the vertical diode 115 formed therein, and the phase change nano band 140 is formed by using an anisotropic etching method, that is, a spacer etching method. Since the phase change nano band 140 is formed without separate modified process for forming a pattern of below an exposure limit, it can reduce the contact area between the heating electrode 120 and the phase change nano band 140, thereby improving the reset current characteristic.

Figure 6:
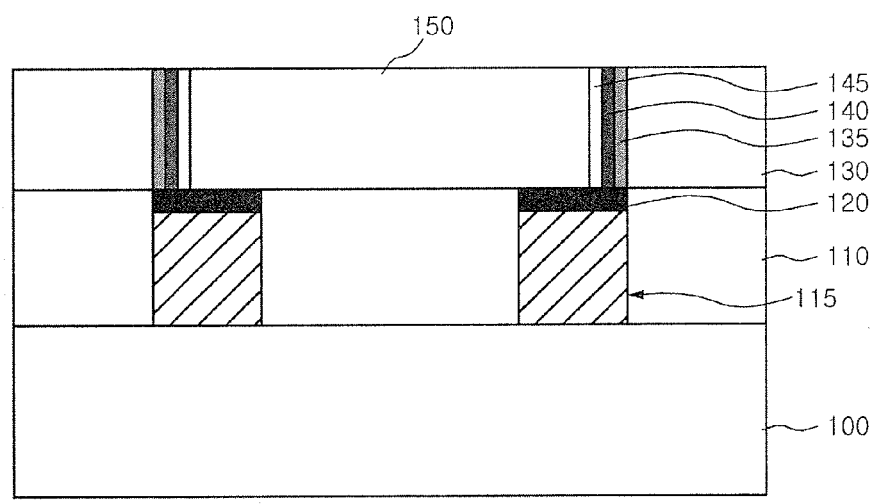
FIG. 6 is a cross-sectional view of a high integration phase change memory device according to another exemplary embodiment.
Figure 7:
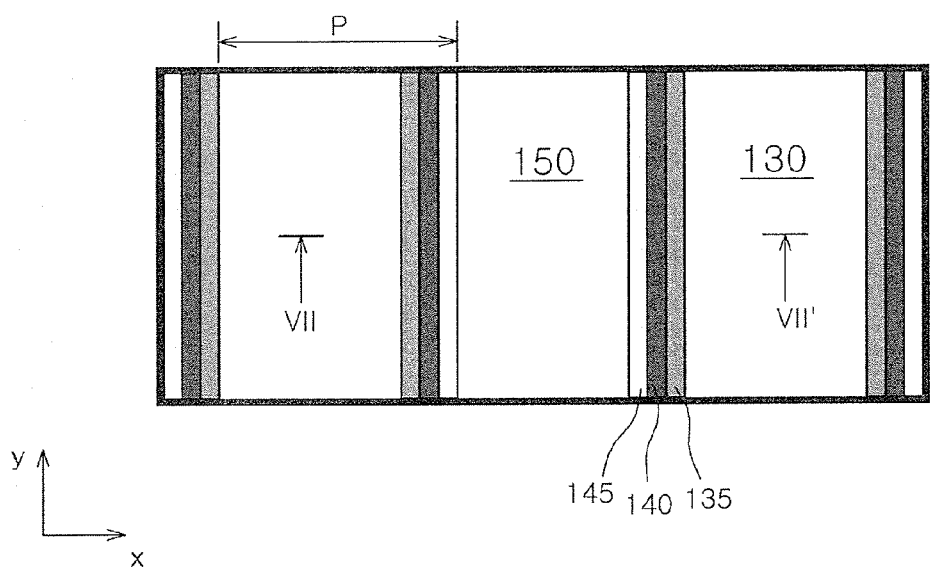
FIG. 7 is a plan view of the high integration phase change memory device according to another exemplary embodiment.

FIG. 6 is a cross-sectional view of a high integration phase change memory device according to another exemplary embodiment and FIG. 7 is a plan view of the high integration phase change memory device according to another exemplary embodiment, wherein FIG. 6 is the sectional view cut taken along the line VII-VII' of FIG. 7.

The embodiment shown in FIGS. 6 and 7 is carried out the by same processes as the exemplary embodiment of FIGS. 1 to 5 until the formation process of the trench T, therefore, description of the same processes is omitted and hereinafter the subsequent processes will be described.

Referring to FIGS. 6 and 7, capping layers 135 are formed on both side walls of the trench T. The capping layers 135 may have the same structure as the exemplary embodiment above. The capping layers 135 may be formed by depositing the capping material layer and anisotropically etching back the capping material to expose the first interlayer insulating layer 130 such that the capping layers 135 remain on both side walls of the trench T, for example in the shape of a spacer. A first phase change material layer is deposited on an upper surface of the first interlayer insulating layer 130 and the surfaces which define the trench T having the capping layers 135 are formed therein. The first change material layer is also anisotropically etched back to expose the upper surface of the first interlayer insulating layer 130, thereby forming first phase change nano bands 140 having a spacer shape on the side walls of the capping layers 135. Subsequently, a second phase change material layer having a different phase change property from the first phase change material layer is formed on the resultant semiconductor substrate 100 having the first phase change nano bands 140 formed therein, and then the second phase change material layer is anisotropically etched back so as to form second phase change nano bands 145 on the side walls of the first phase change nano bands 140.

The first and second phase change nano bands 140 and 145 are comprised of materials which have different phase change properties and are phase-changed at different temperatures, that is, under the application of different currents and voltages. For example, in an exemplary embodiment, the first phase change nano bands 140 may be comprised of a GST (germanium (Ge)-antimony (S)-tellurium (Te))-based phase change material layer and the second phase change nano bands 145 may be comprised of a GT(germanium (Ge)-tellurium (Te))-based phase change material layer or an impurity-doped GST-based phase change material layer.

Figure 8:
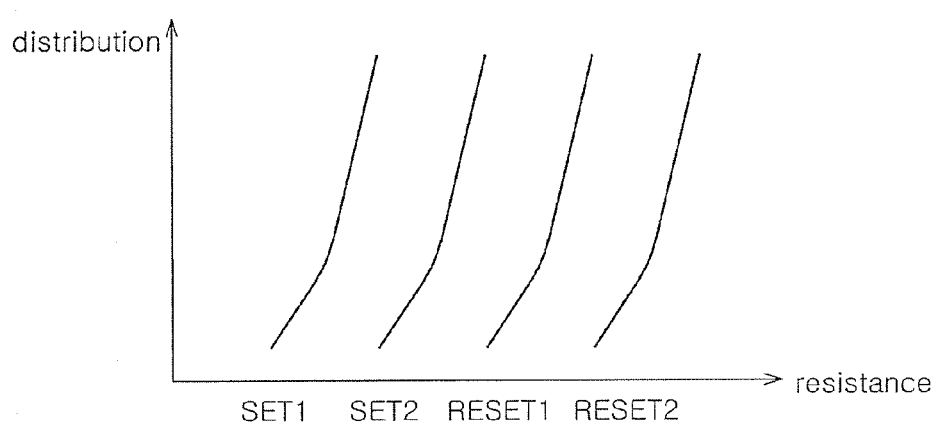
FIG. 8 is a diagram shown for illustrating a resistance distribution of the high integration phase change memory device according to another exemplary embodiment.

Since the first and second phase change nano bands 140 and 145 are phase-changed in different temperature bandwidths, as shown in FIG. 8, resistance distributions SET1, SET2, RESET1, and RESET2 are obtained under the different operation conditions.

As an example, if it is assumed that a phase change temperature of the first phase change nano bands 140 is a temperature "A" and a phase-change temperature of the second phase change nano bands 145 is temperature "B", which is greater than the phase change temperature "A" of the first phase change nano bands 140, when a temperature applied from the heating electrode 120 is between the temperatures "A" and "B", only the first phase change nano bands 140 are phase-changed such that the phase change memory device has the resistance distribution of a first set SET1 or a first reset RESET1.

Meanwhile, when the temperature applied from the heating electrode 120 is greater than "B", both the first and second phase change nano bands 140 and 145 are phase-changed such that the phase change memory device has the resistance distribution of a second set SET2 or a second reset RESET2, which is different from the first set SET1 or the first reset RESET1. Therefore, the phase change memory device of the exemplary embodiment accomplishes multi-level without various voltage gradients.

Next as shown in FIG. 6, a second interlayer insulating layer 150 is deposited to be filled within the trench T and then planarized to expose the first and second phase change nano bands 140 and 145.

It is to be understood that following forming the capping layer 135 of a spacer shape, the first and second phase change nano bands 140 and 145 are formed in the exemplary embodiment, the present invention is not limited thereto, and the capping material layer, the first and second phase change material layers, and the second insulating layer 150 may be formed and then collectively planarized to expose the upper surface of the first interlayer insulating layer 130.

Hereinafter, although not shown in drawings, upper electrodes are formed on the first and second interlayer insulating layers 130 and 150 to be contacted with the first and second chase change nano bands 140 and 145. For example, the upper electrodes may be similar to those shown in FIG. 4.

Figure 9:
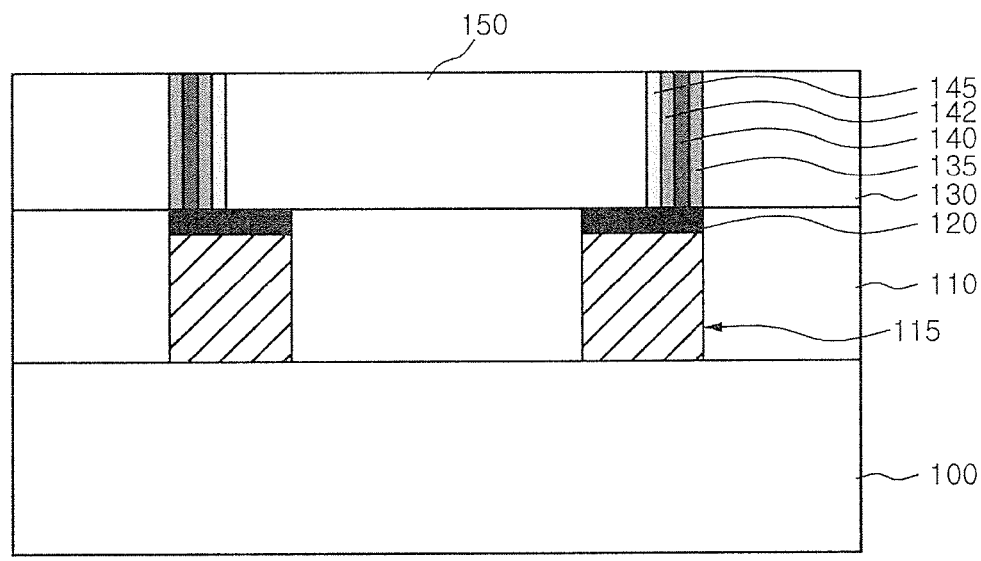
FIG. 9 is a cross-sectional view of a high integration phase change memory device according to another exemplary embodiment.
Figure 10:
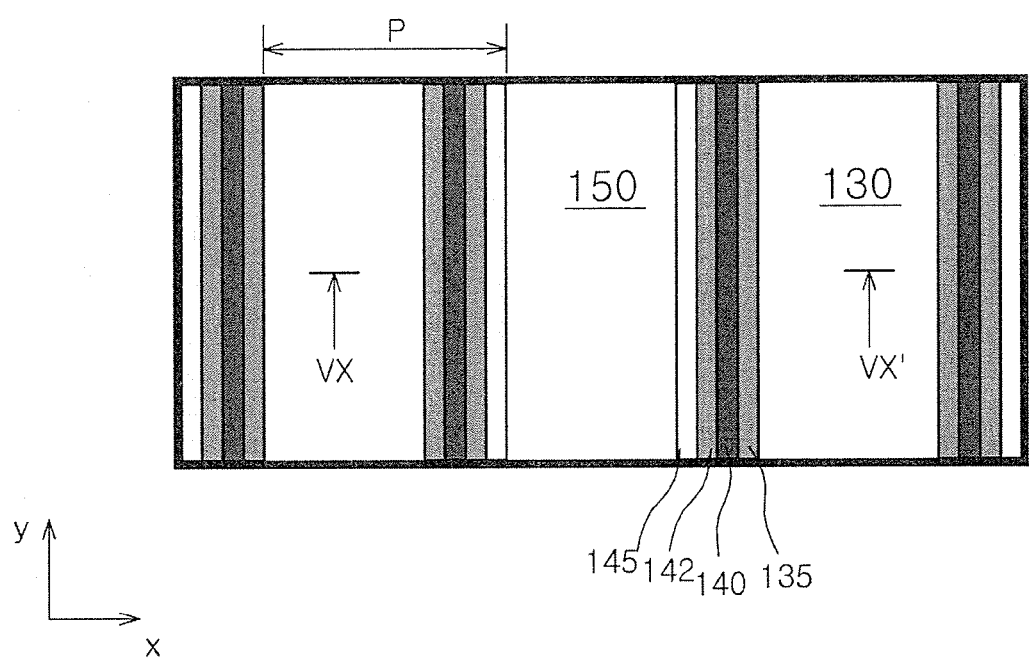
FIG. 10 is a plan view of the high integration phase change memory device according to another exemplary embodiment.

FIG. 9 is a cross-sectional view taken along the line X-X' of FIG. 10 of a high integration phase change memory device according to another exemplary embodiment of the present invention, and FIG. 10 is a plan view of the high integration phase change memory device according embodiment shown in FIG. 9.

As shown in FIGS. 9 and 10, capping layers 142 are further interposed between the first and second phase change material layers 140 and 145. When the first and second phase change nano bands 140 and 145 are phase-changed, the presence of the capping layers 142 can further prevent mutual diffusion between phase change materials constituting the first and second phase change nano bands 140 and 145 and surface effect.

In the exemplary embodiment, the capping layers 135 and 142 and the first and second phase change material layers may be respectively or collectively anisotropically etched back as described above.

According to embodiments of the present invention, a phase change material layer is formed as a phase change nano band structure using a spacer formation method. Since the line width of the phase change nano band structure depends on a deposition thickness of the phase change material layer, the line width of the phase change material layer can be controlled in a nano meter scale as well as in an angstrom scale. Therefore, according to embodiments of the present invention, there is no demand for endeavor to reduce the line widths of the heating electrode and the phase change material layer below a limit of exposure. Furthermore, according to embodiments of the present invention, a plurality of phase change nano bands having different phase change properties can be contacted with one heating electrode such that a number of resistance distributions are generated to simply embody a multi level phase change memory.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A high integration phase change memory device, comprising:
    a semiconductor substrate including an access device;
    a heating electrode formed on the access device;
    a phase change nano band formed on the heating electrode;
    an interlayer insulating layer formed along sides of the phase change nano band so as to support the phase change nano band; and
    a capping layer interposed between at least one of the sides of the phase change nano band and the interlayer insulating layer.

2. The high integration phase change memory device of claim 1, wherein a line width of the heat electrode is substantially equal to a line width of the access device.

3. The high integration phase change memory device of claim 1, wherein the capping layer is comprised of a material configured to prevent a phase change material of the phase change nano band from migrating.

4. The high integration phase change memory device of claim 1, further comprising an additional phase change nano band comprised of a material different from that of the phase change nano band, the additional phase change nano band being arranged between at least one of the sides of the phase change nano band and the interlayer insulating layer.

5. The high integration phase change memory device of claim 4, wherein a phase change temperature of the additional phase change nano band is different from that of the phase change nano band.

6. The high integration phase change memory device of claim 4, further comprising a capping layer arranged between the additional phase change nano band and the phase change nano band.

7. The high integration phase change memory device of claim 1, wherein the access device comprises a vertical diode.

8. The high integration phase change memory device of claim 1, wherein a line width of the phase change nano band is less than a line width of the heating electrode.

9. A high integration phase change memory device, comprising:
    a vertical diode;
    a heating electrode formed on the vertical diode;
    a plurality of phase change nano bands formed on the heating electrode;
    an interlayer insulating layer formed along sides of the plurality of phase change nano bands so as to support the plurality of phase change nano bands; and
    a capping layer interposed between at least one of the plurality of phase change memory nano bands and the interlayer insulating layer,
    wherein a total line width of the plurality of phase change nano bands is less than a line width of the heating electrode, and
    wherein the plurality of phase change nano bands have different phase change properties each other.

10. The high integration phase change memory device of claim 9, wherein the line width of the heating electrode is substantially equal to a line width of the vertical diode.

11. The high integration phase change memory device of claim 9, wherein the plurality of phase change nano bands comprises:
    a first phase change nano band having a spacer shape; and
    a second phase change nano band having a spacer shape, the second phase change nano band formed on one side of the first phase change nano band, wherein a temperature at which a phase-change of the second phase change nano band occurs is different from a temperature at which a phase-change of the first change nano band occurs.

12. The high integration phase change memory device of claim 11, further comprising a capping layer interposed between the first and second phase change nano bands.

13. A method of manufacturing a high integration phase change memory device, comprising:
    forming a plurality of access devices on a semiconductor device;
    forming a plurality of heating electrodes on the plurality of access devices, respectively;
    forming a first interlayer insulating layer having a trench defined therein, the trench exposing a pair of heating electrodes of the plurality of heating electrodes;
    capping layers on the side walls of the trench of the first interlayer insulating layer;
    forming first phase change nano bands along side walls of the trench; and
    forming a second interlayer insulating layer filled within the trench between the first phase change nano bands.

14. The method of claim 13, wherein the forming the plurality of access device comprises:
    depositing an insulating layer on the semiconductor device;
    defining a plurality of contact holes in the insulating layer; and
    forming diodes within the plurality of contact holes, respectively,
    wherein each of the diodes is formed to have a height less than a depth of each of the plurality of contact holes.

15. The method of claim 14, wherein forming the plurality of heating electrodes comprises filling a conductive material within the plurality of contact holes on the diodes formed therein.

16. The method of claim 13, wherein the forming the first phase change nano bands comprises:
    forming a phase change material layer having a predetermined thickness on an upper surface of the first interlayer insulating layer and on surfaces defining the trench; and
    anisotropically etching the phase change material layer to expose the upper surfaces of the first interlayer insulating layer and an upper surface of the pair of heating electrodes.

17. The method of claim 16, further comprising forming additional phase change nano bands on a side surface of the phase change nano bands,
    wherein a phase change temperature of the additional phase change nano bands is different from a phase change temperature of the first change nano bands.

18. The method of claim 17, further comprising forming capping layers on a side surface of the first phase change nano bands before forming of the additional phase change nano bands.

19. A method of manufacturing a high integration phase change memory device, comprising:
- providing an insulating layer on a semiconductor substrate, the insulating layer having arranged therein a plurality of access devices on the semiconductor substrate and a plurality of heating electrodes on the plurality of access devices;
- forming a first interlayer insulating layer having a trench defined therein, the trench exposing a pair of heating electrodes within the insulating layer;
- forming a plurality of phase change nano bands on side walls of the trench within the first interlayer insulating layer, the plurality of phase change nano bands contacted with each of the plurality of heating electrodes; and
- filling a second interlayer insulating layer between the plurality of phase change nano bands within the trench,
- wherein the plurality of phase change nano bands have different phase change properties each other,
- wherein the forming a plurality of phase change nano bands comprises:
  - forming a first phase change material layer having a predetermined thickness on an upper surface of the first interlayer insulating layer and on surfaces defining the trench;
  - anisotropically etching the first phase change material layer to expose the upper surface of the first interlayer insulating layer and an upper surface of the pair of heating electrodes so as to form first phase change nano bands;
  - forming a second phase change material layer having predetermined thickness on surfaces of the first interlayer insulating layer, the first phase change nano bands and the surfaces defining trench, the second phase change material having a different phase change property from the first phase change material layer; and
  - anisotropically etching the second phase change material layer so as to form second phase change nano bands.

20. The method of claim 19, wherein the forming a plurality of access devices comprises:
- depositing the insulating layer on the semiconductor substrate;
- defining a plurality of contact holes in the insulating layer; and
- forming diodes within the plurality of contact holes, respectively,
- wherein each of the diodes is formed to have a height less than a depth of each of the plurality of contact holes.

21. The method of claim 20, wherein the forming a plurality of heating electrodes comprises filling a conductive material within the plurality of contact holes on the diodes.

22. The method of claim 19, wherein a total thickness of the first and second phase change material layers is less than a line width of each of the plurality of heat electrodes.

23. The method of claim 19, further comprising forming a capping layer on the first phase change nano bands between forming the first phase change nano bands and forming the second phase change material layer.

* * * * *